United States Patent
Püschner et al.

(10) Patent No.: US 6,719,205 B1
(45) Date of Patent: Apr. 13, 2004

(54) CARRIER ELEMENT FOR A SEMICONDUCTOR CHIP FOR INCORPORATION INTO SMART CARDS

(75) Inventors: Frank Püschner, Kehlheim (DE); Jürgen Fischer, Deuerling (DE); Josef Heitzer, Bach (DE)

(73) Assignee: Infineon Technologies AG, Munich (DE)

( * ) Notice: Subject to any disclaimer, the term of this patent is extended or adjusted under 35 U.S.C. 154(b) by 237 days.

(21) Appl. No.: 09/333,322

(22) Filed: Jun. 15, 1999

Related U.S. Application Data

(63) Continuation of application No. PCT/DE98/02768, filed on Sep. 17, 1998.

(30) Foreign Application Priority Data

Oct. 15, 1997 (DE) ........................................ 197 45 648

(51) Int. Cl.[7] .............................................. G06K 19/06
(52) U.S. Cl. .......................................... 235/492; 29/841
(58) Field of Search .................. 235/487, 492; 29/827, 841

(56) References Cited

U.S. PATENT DOCUMENTS

| | | | |
|---|---|---|---|
| 4,460,825 A | * 7/1984 | Haghiri-Tehrani et al. | .. 235/488 |
| 4,746,392 A | 5/1988 | Hoppe | ... 156/244.12 |
| 4,829,666 A | * 5/1989 | Haghiri-Tehrani et al. | .... 29/841 |
| 5,134,773 A | 8/1992 | LeMaire et al. | ...... 29/827 |
| 5,172,214 A | * 12/1992 | Casto | ....... 257/676 |
| 5,898,216 A | * 4/1999 | Steffen | ........ 257/679 |
| 6,049,461 A | * 4/2000 | Haghiri-Tehrani et al. | .. 361/737 |
| 6,049,463 A | * 4/2000 | O'Malley et al. | ....... 361/760 |

FOREIGN PATENT DOCUMENTS

| | | |
|---|---|---|
| DE | 4241684 A1 | 7/1993 |
| DE | 19532755 C1 | 2/1997 |
| DE | 29621837 U1 | 4/1997 |
| DE | 19651549 A1 | 12/1997 |
| JP | 2303056 | 12/1990 |

OTHER PUBLICATIONS

Japanese Patent Abstract No. 3-283437 (Ichii), dated Dec. 13, 1991.
Japanese Patent Abstract No. 08116016 (Tsutomu et al.), dated May 7, 1996.
Japanese Patent Abstract No. 04148999 (Yosuke), dated May 21, 1992.
Japanese Patent Abstract No. 0870085 A (Satoshi et al.), dated Aug. 30, 1994.

* cited by examiner

*Primary Examiner*—Michael G. Lee
*Assistant Examiner*—Jamara A. Franklin
(74) *Attorney, Agent, or Firm*—Laurence A. Greenberg; Werner H. Stemer; Ralph E. Locher

(57) ABSTRACT

A carrier element for a semiconductor chip and in particular for incorporation into smart cards. The carrier element has an encapsulation composition protecting the semiconductor chip. The carrier element connections are disposed on one of the main surfaces of the encapsulation composition along only two opposite edges. They are made of a conductive material and have a reduced thickness at the ends facing one another, the cross section having a step only on one side. The semiconductor chip is disposed on the connections in a region of the section of reduced thickness and is mechanically connected to the connections.

13 Claims, 3 Drawing Sheets

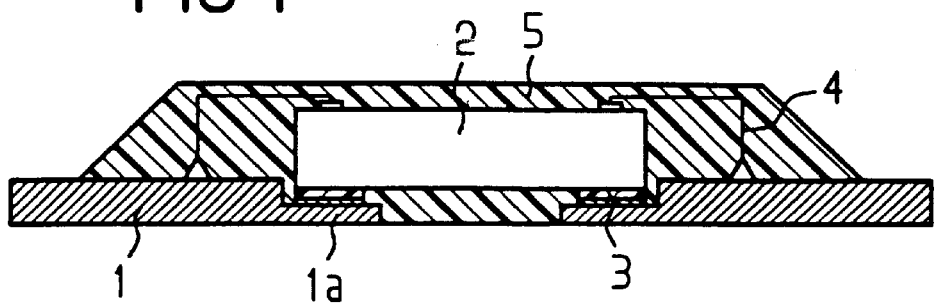
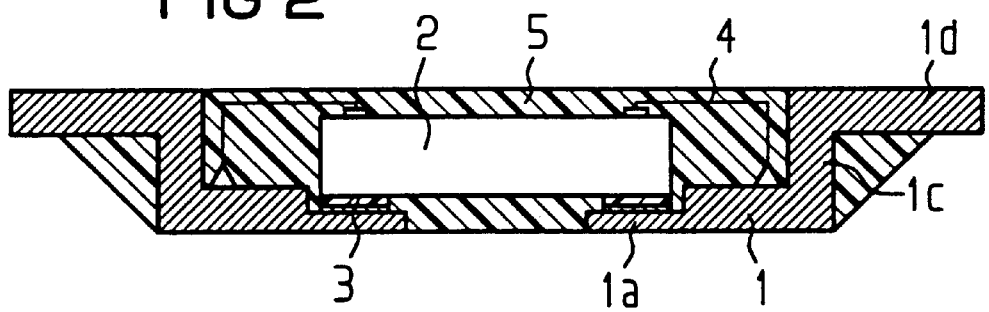
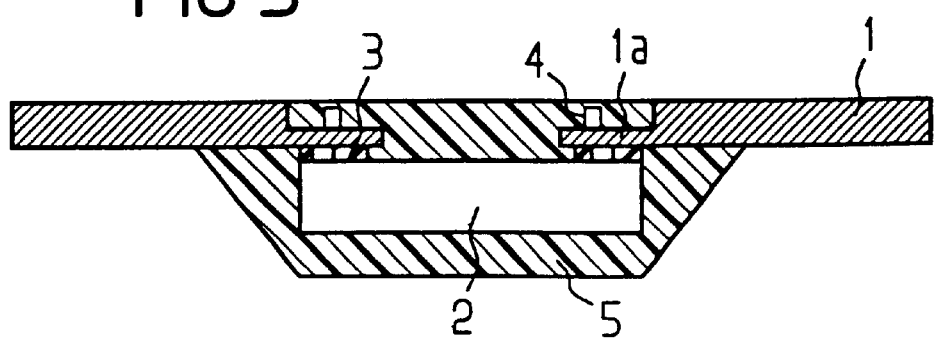

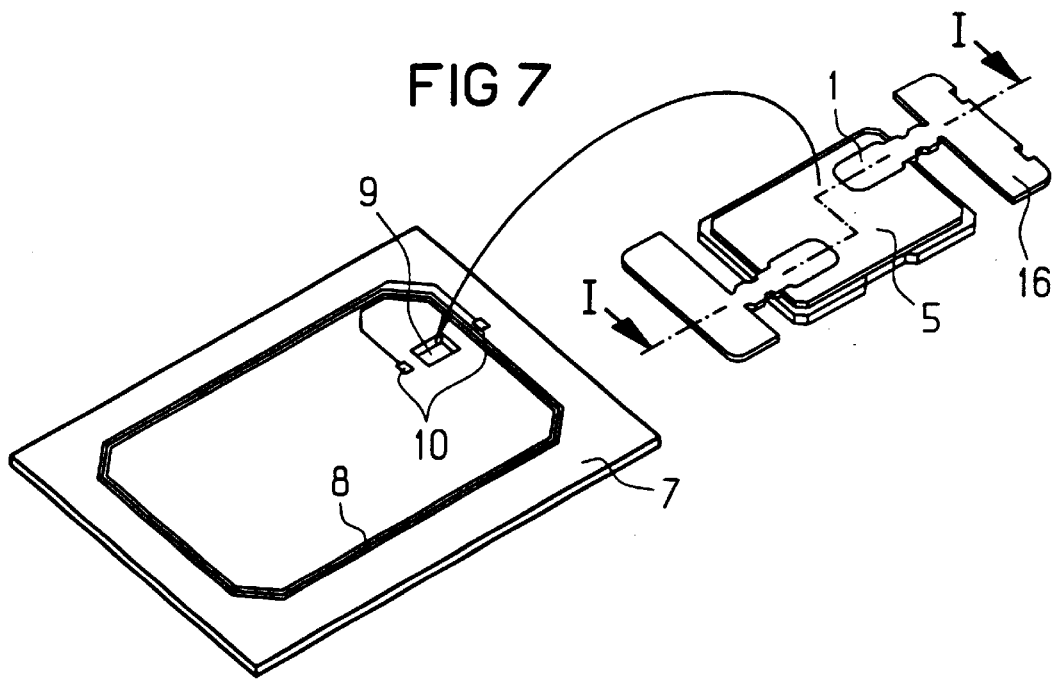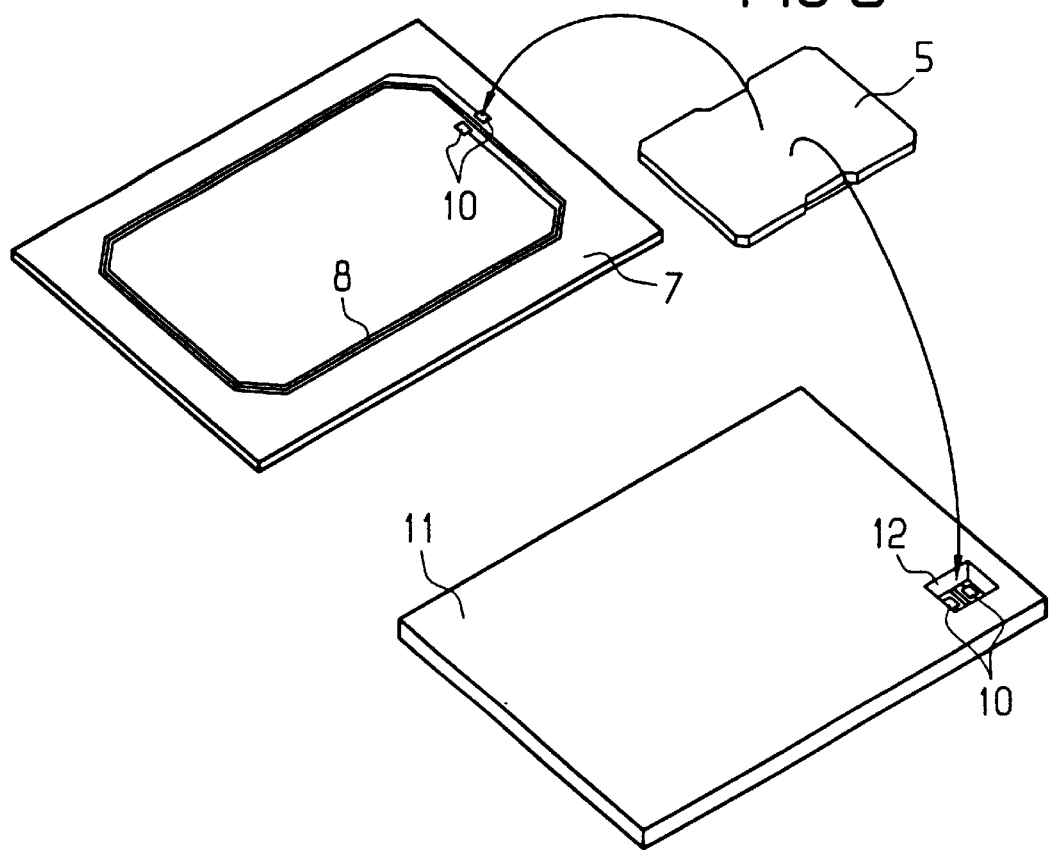

CARRIER ELEMENT FOR A SEMICONDUCTOR CHIP FOR INCORPORATION INTO SMART CARDS

CROSS-REFERENCE TO RELATED APPLICATION

This is a continuation of copending International Application PCT/DE98/02768, filed Sep. 17, 1998, which designated the United States.

BACKGROUND OF THE INVENTION

Field of the Invention

The invention relates to a carrier element for a semiconductor chip with at least two connections, in particular for incorporation into smart cards, the element having an encapsulation composition encapsulating and protecting the semiconductor chip. The connections are made of a conductive material and have a reduced thickness at connection ends facing one another. In addition, the connections have a cross section having a step formed only on one side. The semiconductor chip is disposed on the connections in a region of this section of reduced thickness and is mechanically connected to the connections.

A carrier element is disclosed in JP08-116016 A from Patent Abstracts of Japan. This known carrier element is not suitable for incorporation into smart cards, however, since it is provided with encapsulation composition on both sides and the connections are not suitably accessible.

Carrier elements for a semiconductor chip for incorporation into smart cards have been disclosed in a wide variety of ways. U.S. Pat. No. 5,134,773 discloses a carrier element with contact areas composed of a conductive material in the form of a so-called lead frame, in which the semiconductor chip is bonded onto a centrally disposed chip island and is electrically connected to peripherally disposed contact areas by bonding wires. The semiconductor chip is surrounded by an encapsulation composition that protects it and the bonding wires and, moreover, holds the contact areas in their position. Since the contact areas have to be freely accessible from the side that is remote from the chip, the encapsulation composition is present only on one side. In order, nevertheless, to afford good mechanical retention, the contact areas have undercuts, on the side remote from the chip, in the region of the slots which electrically insulate them from one another, which undercuts are filled by the encapsulation composition and realize a kind of riveted connection.

Although the carrier element described in U.S. Pat. No. 5,134,773 is configured for so-called smart cards with contacts, that is to say it has contact areas which are situated on a surface of the smart card and are externally accessible to a reading device, it is readily possible, and also known, to provide only two connections which can be electrically connected to a coil disposed in the card or on a card inlay.

In addition, it is possible to provide connections in such numbers and with such a configuration that they are equally suitable for connection both to a coil or antenna and to a reading device.

During the production of contactless smart cards using lamination technology formed of a coil carrier sheet onto which the carrier element is mounted and welded with at least two covering sheets, it is important for the carrier element that is to be covered by the lamination, and which may be regarded as a foreign body, to be configured geometrically to be as small as possible in order to enable the covering sheets, which are softened under temperature and pressure, to flow optimally around the carrier element and thus to achieve a high-quality card without any sunken locations and scattered print, in other words to achieve planar surfaces for subsequent printing.

A typical structure for a smart card for contactless application is built up as follows. The coil carrier sheet has a thickness of approximately 200 μm, the two core sheets have a thickness of approximately 100 μm in each case, two printing sheets on both sides have a thickness of approximately 150 μm in each case, and two scratch-protection sheets have a thickness of approximately 50 μm in each case. The resultant thickness is approximately 800 μm in accordance with the ISO Standard 7816. This results in the carrier element necessarily having a height of less than 400 μm as well as the smallest possible extent in the card plane.

In the case of a realization of the carrier element disclosed in U.S. Pat. No. 5,134,773 the resulting height is more than 400 μm, on account of the mounting of the chip on a chip island and the loop height of the bonding wires.

SUMMARY OF THE INVENTION

It is accordingly an object of the invention to provide a carrier element for a semiconductor chip for incorporation into smart cards which overcomes the above-mentioned disadvantages of the prior art devices of this general type, which has a small height and also an improved breaking behavior and, at the same time, is simple to produce.

With the foregoing and other objects in view there is provided, in accordance with the invention, in combination with a semiconductor chip, a carrier element, including:

an encapsulation composition having main surfaces and opposite edges and encapsulating and protecting the semiconductor chip;

at least two connections disposed on one of the main surfaces of the encapsulation composition along only two of the opposite edges, the at least two connections are made of a conductive material and have embossed ends facing one another and with a reduced thickness at the embossed ends and with a cross section having a step only on one side of the at least two connections; and the semiconductor chip is disposed on the at least two connections in a region of the reduced thickness and are mechanically connected to the at least two connections which results in mechanical connections.

The connections, which are part of a holding frame, a so-called lead frame, during the mounting of the semiconductor chip and the encapsulation of the chip and of the connecting lines, have a section which has a smaller thickness in such a way that the cross section has a step only on one side. The section which has the smaller thickness is produced by embossing in a manner according to the invention. In this case, a reduction in the thickness to 50% of the nominal connection thickness is sufficient for most cases.

Therefore, a main surface of the connections is flat while the opposite surface has a step. The semiconductor chip is disposed in the region of this section. It may be disposed on the side of the step or else on the opposite side. It is expedient for the chip to be mounted with its active side oriented away from the connections if it is disposed on the step side of the connections. If it is disposed on the side opposite to the step side, it is advantageous if the chip is mounted with its active side oriented toward the connections, since the bonding wires can then be connected to the connections in the region of the sections having the small thickness and, consequently, the loop height of the bonding wires is no longer significant. The desired height saving is produced in both cases.

The largest possible height saving can be obtained by using so-called flip-chip mounting, in which the semiconductor chip is soldered or bonded onto the connections directly by its terminal pads, which are advantageously provided with elevations, so-called "bumps". This makes it possible to dispense with bonding wires.

Dispensing with a chip island has not only the advantage of a smaller thickness of the carrier element but also that of better anchoring of the encapsulation composition together with the connections, since the encapsulation composition can enclose the chip from both sides and there is a good connection between the chip and the connections. The obviation of the chip island results in that notch effect forces no longer occur either, thereby resulting in better breaking strength properties.

On account of the small height desired for the carrier element, one of the connection surfaces will be exposed and available for contact-making. For the best possible incorporation into a smart card, in particular into a laminated smart card, it is advantageous if the encapsulation composition situated between the connections is flush with the surface of the connections.

The connections may project beyond the dimensions of the encapsulation composition and form contact lugs there for antenna connections. This is advantageous for mounting in the course of which an antenna coil is applied on a carrier sheet. The carrier sheet advantageously has a cutout or recess in which the encapsulation composition is situated, while the connections or, in this case, the contact lugs are situated on the coil carrier sheet on coil connections.

However, it is likewise possible for the connections to be provided only in the region of the encapsulation composition, this having the advantage that such a carrier element can also be inserted subsequently into an already laminated card, which has a cutout, however. In an expedient manner, the ends of the antenna coil will be situated in this cutout in order to be able to be connected in a simple manner to the carrier element connections, for example by bonding or soldering or else by use of resilient connecting parts.

A carrier element that has only such contact areas instead of contact lugs projecting beyond the edge can, however, also be applied directly to a coil carrier sheet. In this case, the corresponding core sheet of the card laminate should have a cutout.

The contact lugs can advantageously have a widened end in order to be able to be connected better to connections of wound coils.

Particularly good anchoring of the encapsulation composition together with the connections is achieved if the connections are bent at a right angle toward the chip and, consequently, the angular regions are situated in the encapsulation composition. If the connections lugs are once again bent at a right angle, preferably in the other direction, even better anchoring is produced. Moreover, further contact areas are produced in this way and can be utilized for alternative mounting.

Other features which are considered as characteristic for the invention are set forth in the appended claims.

Although the invention is illustrated and described herein as embodied in a carrier element for a semiconductor chip for incorporation into smart cards, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–6 are sectional views of various embodiments of a carrier element according to the invention;

FIG. 7 is a perspective view of the carrier element with contact lugs for mounting on a coil carrier sheet; and FIG. 8 is a perspective view of the carrier element with contact areas for mounting on the coil carrier sheet or directly in a smart card.

DESCRIPTION OF THE PREFERRED EMBODIMENTS

Figure 4:
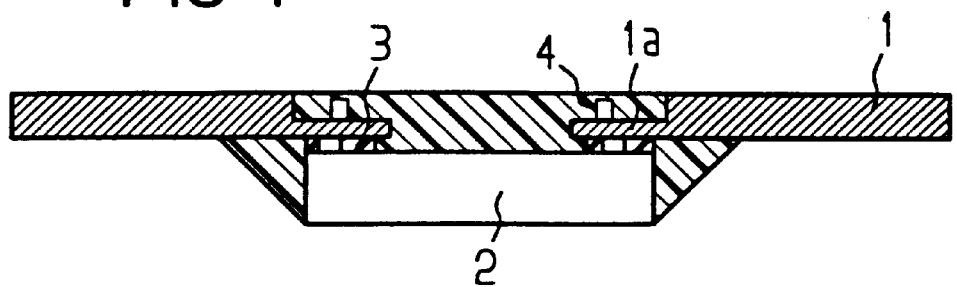

In all the figures of the drawing, sub-features and integral parts that correspond to one another bear the same reference symbol in each case. Referring now to the figures of the drawing in detail and first, particularly, to FIG. 1 thereof, there is shown a cross section through a carrier element according to the invention, as is indicated in FIG. 7. Two connections 1 are disposed along opposite edges of the carrier element. They serve, on the one hand, as a bearing area for a semiconductor chip 2 and, on the other hand, for making contact with the chip 2 from outside the carrier element. For this purpose, they are connected to the semiconductor chip 2 via bonding wires 4. The semiconductor 2 is mechanically connected to the connections 1 by an adhesive 3. The semiconductor chip 2 and the bonding wires 4 are potted or encapsulated by injection-molding with an encapsulation composition 5. The encapsulation composition 5 advantageously has a light color which, unlike black compositions customarily obtainable commercially, do not show through the layers of a smart card.

As can be seen in FIG. 7, the connections 1 are advantageously disposed in a region of diagonal corners of the carrier element in order to afford a uniform and balanced support for the semiconductor chip 2 during mounting. For mounting purposes, the connections 1 are connected to a frame that holds them, a so-called lead frame, and are stamped out from this after the mounting of the chip and the encapsulation by injection-molding or potting. In the examples illustrated, only two connections 1 are provided since these carrier elements are primarily suitable for contactless smart cards. However, it is readily possible to provide a plurality of connections as contact areas in accordance with the ISO Standard 7816, in order, in this way, to obtain a carrier element for smart cards with contact. What is essential is that there is no chip island present. As a result of this, on the one hand, notch effect forces are avoided and, on the other hand, the encapsulation composition 5 can encapsulate the entire chip 2 and thus effect better adhesion of the connections 1 to the carrier element, since they are largely held by the adhesive bond 3 and not just on the basis of the adhesion forces between the encapsulation composition 5 and the connections 1.

Even better anchoring of the connections 1 is obtained if the latter are angled, as is illustrated in FIG. 2. A first section 1c of the connections 1 is bent approximately at a right angle toward the chip 2. In a development, a second section 1d may likewise be bent approximately at a right angle in the other direction. This produces a further contact area which is accessible externally, with the result that such a carrier element is also suitable for so-called combination cards, since it can be connected to a coil from one side and a reading device can make contact with it from the other side. This necessitates more than two connections, however. It would suffice, however, for just two to be angled.

In addition to the lack of a chip island, the main aspect of the carrier element according to the invention may be seen in a section 1a of the connections 1 which has a thickness smaller than the nominal thickness, in which case, however, there is a step in the cross section only on one side of the connections 1. This enables the overall height of the carrier element to be reduced by approximately half of the connection thickness, if the semiconductor chip 2 is placed in the region of these sections having the smaller thickness 1a. Since the sections 1a can be kept small, the mechanical properties of the connections 1 are not impaired.

In FIGS. 1 and 2, the semiconductor chip 2 is disposed on the side of the cross-sectional step of the connections 1, the active side of the semiconductor chip 2, that is to say the side having the integrated circuits, being oriented away from the connections 1. FIGS. 3 and 4 show variants in which the semiconductor chip 2 is disposed on that side of the connections 1 which is opposite to the cross-sectional step, the active side being oriented toward the connections 1. In this case, the bonding wires 4 are led, in the manner according to the invention, to the sections which have the smaller thickness 1a, so that no additional height need be provided for the carrier element as a result of the loop height of the bonding wires. A further height saving can be attained if the rear side of the chip is not provided with encapsulation composition 5, as is illustrated in FIG. 4. This is possible since the active side of the semiconductor chip 2 is oriented toward the connections 1.

Figure 5:
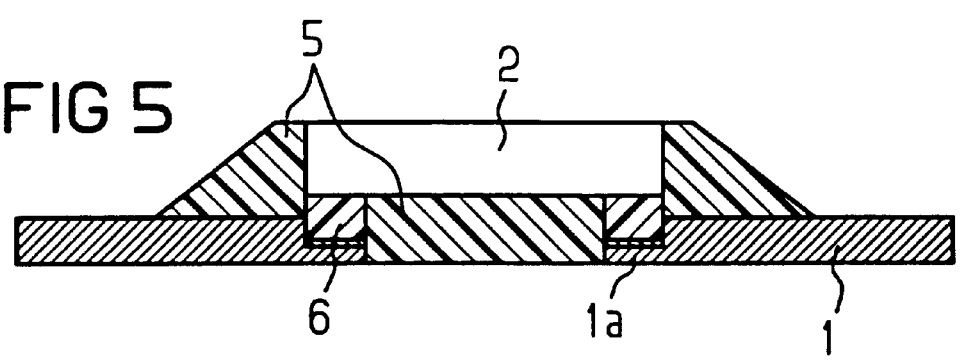
Figure 6:
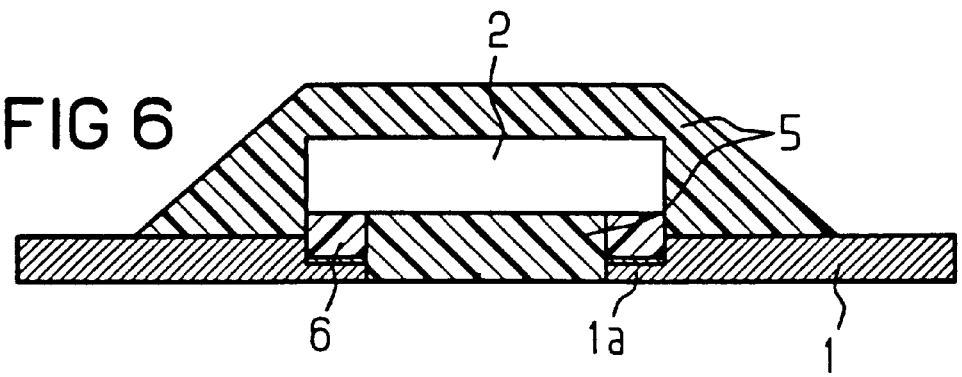

FIGS. 5 and 6 show further mounting variants, in which the semiconductor chip 2 is connected to the connections 1 using so-called flip-chip technology. The terminal pads of the chip 2 are in this case connected directly to the connection sections that have a smaller thickness 1a. Prior to this they may be provided with conductive elevations 6, so-called "bumps" or soldering bumps. The smallest height is that of the carrier element in accordance with FIG. 6, in which the semiconductor chip 2 is mounted in the region of the sections which have the smaller thickness 1a, using flip-chip technology, and the rear side of the chip remains uncovered by encapsulation composition 5.

FIG. 7 shows a possible variant of the incorporation of the carrier element according to the invention into a carrier sheet 7 for an antenna coil 8. The carrier element has connections 1 with contact lugs, that is to say connections 1 which project beyond the edge of the encapsulation composition 5. The contact lugs have widened ends 16 in order to enable better contact-making with coil connections 10. In the course of mounting, the encapsulation composition 5 is inserted into a cutout 9 in the carrier sheet 7, the contact lugs 1 making contact with the coil connections 10. This mounting variant enables the carrier element to be incorporated into a laminated card in a particularly planar manner.

FIG. 8 shows a variant in which the connections 1 are configured as contact areas (which cannot be seen in the figure since they are situated on the underside of the carrier element). It is indicated that the sections projecting beyond the edge of the encapsulation composition 5 have been removed, for example as early as during stamping from the lead frame. The carrier element is placed onto the coil carrier sheet 7 and contact-connected to the coil connections 10. In order to obtain a planar smart card surface, the upper core sheet of the smart card laminate must have a cutout.

This embodiment of the carrier element can, however, also be inserted subsequently into a card 11 that has already been laminated or else cast, the card having a cutout 12 for this purpose. The coil connections 10 can be seen in the cutout 12 and, by virtue of this preferred position, they enable simple contact-making with the carrier element connections 1.

This subsequent incorporation of the carrier element into a smart card 11 makes it possible, in a simple manner, to produce a so-called combination card which, on the one hand, has contact areas for making contact with a reading device, the contact areas being situated on a surface of the smart card 11, and, on the other hand, contains the coil 8. The carrier element in accordance with FIG. 2 is particularly suitable for this.

We claim:

1. In combination with a semiconductor chip, a carrier element, comprising:
   an encapsulation composition having main surfaces and opposite edges and encapsulating and protecting the semiconductor chip;
   at least two connections disposed on one of said main surfaces of said encapsulation composition along only two of said opposite edges, said at least two connections made of a conductive material and having embossed ends facing one another with a reduced thickness at said embossed ends and with a cross section having a step only on one side of said at least two connections; and
   the semiconductor chip disposed on said at least two connections in a region of said reduced thickness and being mechanically connected to said at least two connections resulting in mechanical connections.

2. The carrier element according to claim 1, wherein said at least two connections each have an exposed surface flush with one of said main surfaces of said encapsulation composition.

3. The carrier element according to claim 1, wherein said at least two connections run only in a region of said encapsulation composition and form contact areas there.

4. The carrier element according to claim 1, wherein said at least two connections project beyond said opposite edges of said encapsulation composition and form contact lugs.

5. The carrier element according to claim 4, wherein said contact lugs have a widened end.

6. The carrier element according to claim 1, wherein the semiconductor chip has a side with circuit structures and disposed on said at least two connections with said side having said circuit structures oriented toward said at least two connections.

7. The carrier element according to claim 6, wherein the semiconductor chip is disposed on said one side of said at least two connections having said cross section with said step.

8. The carrier element according to claim 7, wherein said mechanical connections also function as electrical connections.

9. The carrier element according to claim 7, including bonding wires forming electrical connections between the semiconductor chip and said at least two connections.

10. The carrier element according to claim 1, wherein the semiconductor chip has a side with circuit structures, the semiconductor chip disposed on said one side of said at least two connections having said cross section with said step and said circuit structures are oriented away from said at least two connections, and including bonding wires forming electrical connections between the semiconductor chip and said at least two connections.

11. The carrier element according to claim 1, wherein said at least two connections are each bent approximately at a right angle toward the semiconductor chip.

12. The carrier element according to claim 11, wherein said at least two connections are each further angled again approximately at a right angle away from the semiconductor chip.

13. In combination with a semiconductor chip, a carrier element to be incorporated into a smart card, the carrier element comprising:

an encapsulation composition having main surfaces and opposite edges and encapsulating and protecting the semiconductor chip;

at least two connections disposed on one of said main surfaces of said encapsulation composition along only two of said opposite edges, said at least two connections made of a conductive material and having embossed ends facing one another with a reduced thickness at said embossed ends and with a cross section having a step only on one side of said at least two connections; and the semiconductor chip disposed on said at least two connections in a region of said reduced thickness and being mechanically connected to said at least two connections resulting in mechanical connections.

* * * * *

UNITED STATES PATENT AND TRADEMARK OFFICE
CERTIFICATE OF CORRECTION

PATENT NO.   : 6,719,205 B1
DATED        : April 13, 2004
INVENTOR(S)  : Puschner et al.

It is certified that error appears in the above-identified patent and that said Letters Patent is hereby corrected as shown below:

Title page,
Item [*] Notice, delete "237" and insert -- 508 --.

Signed and Sealed this

Thirtieth Day of August, 2005

JON W. DUDAS
*Director of the United States Patent and Trademark Office*